(12) United States Patent
Prentice et al.

(10) Patent No.: US 6,763,228 B2
(45) Date of Patent: Jul. 13, 2004

(54) PRECISION AUTOMATIC GAIN CONTROL CIRCUIT

(75) Inventors: John S. Prentice, Palm Bay, FL (US); Patrick J. Landy, Melbourne, FL (US)

(73) Assignee: Intersil Americas, Inc., Irvine, CA (US)

( * ) Notice: Subject to any disclaimer, the term of this patent is extended or adjusted under 35 U.S.C. 154(b) by 366 days.

(21) Appl. No.: 10/027,386

(22) Filed: Dec. 21, 2001

(65) Prior Publication Data

US 2002/0086651 A1 Jul. 4, 2002

Related U.S. Application Data

(60) Provisional application No. 60/259,295, filed on Jan. 2, 2001.

(51) Int. Cl.[7] .................................................. H04B 1/04
(52) U.S. Cl. ........................... 455/127.2; 455/234.1; 330/278; 330/291
(58) Field of Search .................... 455/127.1, 127.2, 455/127.3, 232.1, 234.1, 234.2; 330/252, 260, 254, 261, 271, 273, 278, 285, 291

(56) References Cited

U.S. PATENT DOCUMENTS

| | | | | |
|---|---|---|---|---|
| 4,101,841 A | * | 7/1978 | Okada et al. | 330/254 |
| 4,134,078 A | * | 1/1979 | Arai et al. | 330/254 |
| 4,458,210 A | | 7/1984 | Horl | |
| 4,502,021 A | | 2/1985 | Hill et al. | |
| 4,514,702 A | * | 4/1985 | Zogg | 330/254 |
| 5,077,541 A | * | 12/1991 | Gilbert | 330/284 |
| 5,157,350 A | | 10/1992 | Rubens | |
| 5,575,001 A | | 11/1996 | Ku | |
| 5,684,431 A | | 11/1997 | Gilbert et al. | |
| 5,712,594 A | | 1/1998 | Kimura | |
| 5,742,203 A | * | 4/1998 | Van De Plassche et al. | 330/254 |
| 5,880,631 A | | 3/1999 | Sahota | |
| 6,078,219 A | | 6/2000 | Justice et al. | |
| 6,141,169 A | | 10/2000 | Pietruszynski et al. | |

FOREIGN PATENT DOCUMENTS

| | | |
|---|---|---|
| EP | 0 600 141 A | 6/1994 |
| EP | 0 821 473 A | 1/1998 |

OTHER PUBLICATIONS

PCT Notification of Transmittal of the International Search Report or the Declaration, dated Mar. 17, 2003, 4 pages.
PCT Notification of Transmittal of International Search Report or the Declaration, dated Aug. 6, 2003, 5 pages.
PCT Notification of Transmittal of International Search Report or the Declaration, dated Sep. 10, 2003, 4 pages.

* cited by examiner

*Primary Examiner*—Edward F. Urban
*Assistant Examiner*—Nhan T Le
(74) *Attorney, Agent, or Firm*—Hunton & Williams (57) ABSTRACT

An automatic gain control (AGC) amplifier including a high gain transimpedance amplifier, a resistive feedback network and multiple transconductance stages coupled in the feedback path of the AGC amplifier. The feedback network receives an input signal and is coupled to the output of the high gain amplifier and has multiple intermediate nodes. Each transconductance stage has an input coupled to an intermediate node of the feedback network and an output coupled to the input of the high gain amplifier. Each transconductance stage is independently controllable to position a virtual ground within the feedback network to control closed loop gain. Each transconductance stage may have a bias current input coupled to a bias current control circuit. The control circuit controls each bias current to vary the gain of the AGC amplifier. The bias currents may be linearly controlled employing a ramp function to achieve a linear in dB gain response.

32 Claims, 7 Drawing Sheets

PRECISION AUTOMATIC GAIN CONTROL CIRCUIT

CROSS-REFERENCE TO RELATED APPLICATIONS

The present application is based on U.S. Provisional Patent Application entitled "Precision Automatic Gain Control Circuit", Ser. No 60/259,295, filed Jan. 2, 2001, which is hereby incorporated by reference in its entirety. The present application is a Continuation-In-Part to U.S. patent application entitled "A Calibrated DC Compensation System For A Wireless Communication Device Configured In A Zero Intermediate Frequency Architecture", Ser. No. 09/677,975, filed Oct. 2, 2000, which is hereby incorporated by reference in its entirety.

FIELD OF THE INVENTION

The present invention relates to gain control of amplifiers, and more particularly to a precision automatic gain control circuit.

DESCRIPTION OF RELATED ART

Automatic Gain Control (AGC) circuits are used in many communication and signal processing applications. For example, in the receiver of a wired or wireless communication link, the intended signal to be processed may be a short distance away and therefore relatively strong while another signal may be a long distance away and much weaker. The receiver must process both the strong signals and the weak signals which implies a variable gain function. High gain is used to detect and amplify weak signals and low gain and/or attenuation is used to process strong signals.

The most simple gain stage that can implement an AGC function is the basic differential pair of transistors. An exemplary differential pair stage includes a pair of bipolar transistors Q1, Q2 having their emitters coupled together and to a bias current sink. A pair of load or bias resistors is each coupled between a respective collector of the differential pair and a voltage supply signal. A differential input is applied across the bases of the transistors, and a differential output is developed across the respective collectors. The gain of this stage is the transconductance of either transistor Q1 or Q2 multiplied by the load resistance. By simply varying the transconductance, the gain is changed. The transconductance can be varied by changing the bias current. A fundamental problem with this type of Automatic Gain Control (AGC) circuit is that it has limited input signal swing capability. Input differential voltages of approximately 50 millivolts (mV) peak to peak begin to cause significant nonlinearities, which are unacceptable in many applications. Such nonlinearities, for example, may result in a total harmonic distortion (THD) that is greater than 1%. In high performance systems, AGC functions may need to handle input differential voltages as large as two (2) volts peak to peak, making this AGC stage unacceptable.

The next most common gain stage used for AGC functions is the differential pair with emitter degeneration. This gain stage is similar to the simple gain stage just described and further includes a pair of emitter degeneration resistors to increase the input signal swing capability. In particular, the emitters of the differential pair of transistors Q1, Q2 are not connected to each other. Instead, each emitter is coupled to one end of a respective one of the emitter degeneration resistors. The other ends of the resistors are coupled together and to the bias current sink. The emitter degeneration resistors are ideally linear. The overall transconductance of this stage is decreased by the emitter resistors and their presence allows for more of the input signal to appear across these resistors than across the nonlinear base-emitter junctions of the transistors Q1 or Q2. This results in significantly improved linear handling of large input differential voltages. As the emitter resistors are increased, however, the overall transconductance of the stage becomes less and less dependent on the transistor's transconductance and more dependent on the emitter resistors. A fundamental problem with this arrangement is that the ability to vary the gain by changing the bias current is severely limited as the emitter resistors are increased.

More advanced AGC circuits have been suggested. One idea is to provide an analog attenuator in front of a fixed gain operational amplifier (op-amp). There are several problems with this arrangement for certain applications. First, the analog attenuator circuit requires a stack (cascode) of at least three transistors and resistors, which reduce voltage swing capability. Next, placing an attenuator in front of a large fixed gain amplifier forces the resistors that make up part of the attenuator circuitry to be very low-valued in order to meet reasonable noise performance. These low valued resistors require significant supply current.

SUMMARY OF THE PRESENT INVENTION

An automatic gain control (AGC) amplifier according to an embodiment of the present invention includes a high gain amplifier, a feedback network and multiple amplifier stages coupled in the feedback path of the AGC amplifier. The feedback network has a first end that receives an input signal of the AGC amplifier, a second end coupled to the output of the high gain amplifier and multiple intermediate nodes. Each amplifier stage has an input coupled to a corresponding intermediate node of the feedback network and an output coupled to the input of the high gain amplifier. Each amplifier stage is independently controllable to position a virtual ground within the feedback network to control the closed loop gain of the AGC amplifier.

In respective embodiments, the high gain amplifier may be a transimpedance amplifier. Also, each amplifier stage may be a transconductance stage. In this manner, a voltage at an intermediate node of the feedback network is converted to a current by a transconductance stage, which current is applied to the input of the transimpedance amplifier. The transimpedance amplifier converts currents from all of the transconductance stages into an output voltage, which is applied to an output end of the feedback network. Further, each transconductance stages may include a controllable bias current device, so that the gain of the AGC amplifier is controlled by a transconductance ratio, which is further controlled by the respective currents of the bias current devices. In particular, the bias current devices are controlled to change the transconductance of each transconductance stage, which varies the overall closed loop gain of the AGC amplifier.

The feedback network may include resistors coupled in series between the input signal and the output signal and having at least two intermediate junctions. The amplifier stages are controlled to position a virtual ground at or between the intermediate junctions, so that the gain of the AGC amplifier may be defined by a resistive ratio of resistors in the feedback network.

The AGC amplifier may be configured to operate with differential signals. In particular, the high gain amplifier may be a differential amplifier having a differential input and a differential output. The feedback network may have a differential input for receiving a differential input signal, a differential output coupled to the differential output of the high gain amplifier and two or more intermediate differential nodes. Each amplifier stage may have a differential input coupled to a respective intermediate differential node of the feedback network and a differential output coupled to the differential input of the high gain amplifier.

In a more particular differential embodiment, each amplifier stage includes a differential pair of bipolar transistors (e.g. NPN bipolar junction transistors) having a common-coupled pair of emitters, a pair of bases forming the differential input and a pair of collectors forming a differential output. Each amplifier stage further includes a controllable bias current device coupled to the common-coupled pair of emitters of the differential pair of bipolar transistors. Also, the feedback network may include first and second sets of resistors, each set coupled in series between corresponding polarities of the differential input signal and the differential output of the high gain amplifier. The dual series-coupled resistor sets form two or more intermediate differential nodes. Shunt resistors may be included, each coupled between first and second polarities of an intermediate differential node of the series-coupled resistor sets.

In one embodiment, each amplifier stage has a bias terminal. A control circuit is provided that develops a plurality of bias currents, each provided at a bias terminal of a corresponding amplifier stage. In this manner, the bias currents of the control circuit are used to vary the gain of the AGC amplifier. The control circuit may be implemented in any desired fashion to control the gain. In one embodiment, the control circuit is configured to vary gain of the AGC amplifier in an exponential fashion, such as linear in decibels (dB) or the like. Alternatively, the control circuit may be devised to change the gain in a linear fashion. Any useful gain relationship may be employed.

In more specific configurations, a collective sum of the bias currents of the control circuit is maintained at a constant level while varying the gain of the AGC amplifier. Also, the control circuit may be configured to assert up to two bias currents at any given time throughout a predetermined gain range. Further, the asserted pair of bias currents may be asserted in linear fashion, such as a first bias current being linearly increased between a minimum current level and a maximum current level while a second bias current is linearly decreased between the minimum and maximum current levels. The control circuit may receive a differential control input current and include several current summing and differencing circuits to develop the bias currents. Such summing and differencing circuits may be employed, for example, to develop a plurality of ramped or triangular shaped bias current waveforms based on the differential control input current for generating precise current ratios and turn-on and turn-off set points.

The predetermined gain range of the AGC amplifier may have multiple intermediate gain levels based on the bias currents. For example, the gain may be varied from a first gain level to a second gain level by linearly increasing a first bias current from a minimum current level to a maximum current level while linearly decreasing a second bias current from the maximum current level to the minimum current level. Also, the gain may be varied from the second gain level to a third gain level by linearly decreasing the second bias current from the maximum current level to the minimum current level while linearly increasing a third bias current from the minimum current level to the maximum current level, and so on. As many intermediate nodes, amplifier stages and bias currents may be employed to provide any level of gain control as desired. The gain range is only limited by the physical components employed to implement the AGC amplifier, such as the voltage limits of the high gain amplifier. It is noted, however, that individual AGC amplifiers may be implemented in a cascaded configuration. In this manner, the output of a first AGC stage is multiplied by the gain of a second stage, and the output of the second stage may be multiplied by the gain of a third stage, and so on.

An integrated circuit (IC) according to an embodiment of the present invention may include at least one input terminal for receiving an input signal, at least one output terminal for providing an output signal, at least one control terminal for receiving a gain adjust signal, and an automatic gain control (AGC) amplifier incorporated onto the IC. The AGC amplifier has an input and an output coupled in a processing path between the input and output terminals of the IC and has a control input that receives the gain adjust signal.

In one embodiment, the AGC amplifier includes a high gain amplifier, a feedback network, and multiple feedback amplifier stages. The feedback network has a first end forming the input of the AGC amplifier, a second end coupled to the output of the high gain amplifier and multiple intermediate nodes in a similar manner as previously described. Each feedback amplifier stage has an input coupled to a respective one of the intermediate nodes of the feedback network, an output coupled to the input of the high gain amplifier, and a control input. A gain control circuit is provided, which has an input for receiving the gain adjust signal and multiple bias control outputs. Each bias control output is coupled to a control input of a feedback amplifier stage. The gain control circuit asserts a bias signal at each control input of a feedback amplifier stage to position a virtual ground within the feedback network to control closed loop gain of the AGC amplifier based on the gain adjust signal.

The IC may be configured as a radio frequency (RF) communication chip, such as a zero-intermediate frequency (ZIF) transceiver or the like. In one embodiment, the IC includes an input amplifier circuit, an oscillator circuit, a mixer circuit and a filter circuit.

The input amplifier circuit has an input coupled to the IC input terminal for receiving an RF receive signal and an output that asserts an amplified RF signal. The oscillator circuit asserts a carrier signal to an input of the mixer circuit, which has a second input coupled to receive the amplified RF signal. The mixer circuit has an output for asserting a mixed channel signal. The filter circuit filters the mixed channel signal and asserts a corresponding baseband channel signal. The AGC amplifier receives and amplifies the baseband channel signal.

In another embodiment, the IC operates with in-phase and quadrature signals. For example, the oscillator circuit asserts an in-phase carrier signal and a quadrature carrier signal. The mixer circuit includes a first mixer that receives the in-phase carrier signal and that asserts an in-phase mixed channel signal, and a second mixer that receives the quadrature carrier signal and that asserts a quadrature mixed channel signal. The filter circuit includes a first low-pass filter that filters the in-phase mixed channel signal to develop an in-phase channel signal and a second low-pass filter that filters the quadrature mixed channel signal to develop a quadrature channel signal. The AGC amplifier includes a first and second AGC amplifiers. The first AGC amplifier receives and amplifies the in-phase channel signal and asserts a first amplified in-phase channel signal on a first output terminal of the IC. The second AGC amplifier receives and amplifies the quadrature channel signal and asserts a second amplified in-phase channel signal on a second output terminal of the IC. Each AGC amplifier has multiple control inputs coupled to the bias control outputs of the gain control circuit. In this manner, the gain control circuit simultaneously controls both AGC amplifiers.

The IC signals may be differential signals. For the differential configurations, the high gain amplifier may be a differential amplifier with a differential input and a differential output. The feedback network may have a differential input for receiving a differential input signal, a differential output coupled to the differential output of the high gain amplifier, and multiple intermediate differential nodes. Each amplifier stage may have a differential input coupled to a respective intermediate differential node of the feedback network and a differential output coupled to the differential input of the high gain amplifier. In a similar manner as described previously, the amplifier stages may be configured as transconductance stages, each having a bias current input. The gain control circuit develops a bias current for each transconductance stage to control the gain of both AGC amplifiers.

A gain control circuit according to an embodiment of the present invention controls the gain of an AGC amplifier having a high gain differential amplifier and a differential feedback network with multiple intermediate differential nodes coupled together in a similar manner as previously described. The gain control circuit includes multiple transconductance stages and a control circuit. Each transconductance stage has a differential input for coupling to a respective intermediate differential node of the feedback network, a differential output for coupling to the differential input of the high gain differential amplifier, and a bias control input. The control circuit has an input for receiving the gain adjust signal and multiple bias control outputs. Each bias control output is coupled to a control input of a corresponding transconductance stage. The control circuit asserts a bias signal at each control input to position a virtual ground within the feedback network to control closed loop gain of the AGC amplifier based on the gain adjust signal.

The control circuit may be configured in any desired fashion for controlling the transconductance stages to further control the gain of the AGC amplifier. For example, the control circuit may be configured so that a collective sum of asserted bias currents remains substantially constant while varying the gain of the AGC amplifier throughout a predetermined gain range. Also, the control circuit is configured so that only two bias currents are asserted at a time throughout the gain range, and where each asserted bias current is linearly varied between a predetermined minimum current level and a predetermined maximum current level. The control circuit may receive a differential gain adjust control current and include several current summing and current differencing circuits. In one embodiment, the control circuit includes several current differencing circuits, each including metal oxide semiconductor (MOS) transistors coupled together to form a pair of input terminals receiving the differential gain adjust control current and an output terminal asserting a difference current. The relative sizes of the MOS transistors are selected to achieve a desired differencing function.

In a specific MOS-based embodiment, each differencing circuit includes first, second, third fourth P-channel MOS (PMOS) transistors, each having sources coupled to a supply signal. The drain of the first PMOS transistor forms the output terminal. The gates of the first and second PMOS transistors are coupled together and to the drains of the second and third PMOS transistors to form a first input terminal. The gates of the third and fourth PMOS transistors are coupled together and to the drain of the fourth PMOS transistor to form a second input terminal. A summing circuit may be provided, which includes first and second PMOS transistors having their sources coupled to the supply signal. The gates of both transistors are coupled together and to the drain of the second PMOS transistor to form a summing junction. The drain of the first PMOS transistor forms an output terminal that sums currents applied at the summing junction.

It is appreciated that a gain circuit as described herein has a gain that is varied as the virtual ground is varied. The gain is determined by a resistor and/or transconductance ratio, which can change linearly, exponentially (e.g., linear in dB), or according to any other useful function. A gain control network is provided which is within and part of the closed loop amplifier gain circuit. The gain circuit may be DC or AC coupled, and may be cascaded with other similar gain circuits. A differential gain circuit is disclosed that does not require a common mode reference. The gain circuit has a low absolute gain tolerance and excellent gain matching across different gain circuits on the same silicon die of an IC. A control circuit is described that allows optimization of both noise and linearity performance in the gain circuit. This capability is allowed for by individually sequencing transconductance cells that make up the gain circuit so that only two are active at any given time. The control circuit may implement a ramp function which has precise current ratio capability and precise turn-on and turn-off set points. The control circuit may also be cascaded if desired.

BRIEF DESCRIPTION OF THE DRAWINGS

A better understanding of the present invention can be obtained when the following detailed description of embodiments of the invention is considered in conjunction with the following drawings, in which.

DETAILED DESCRIPTION OF THE EMBODIMENTS OF THE INVENTION

Figure 1:
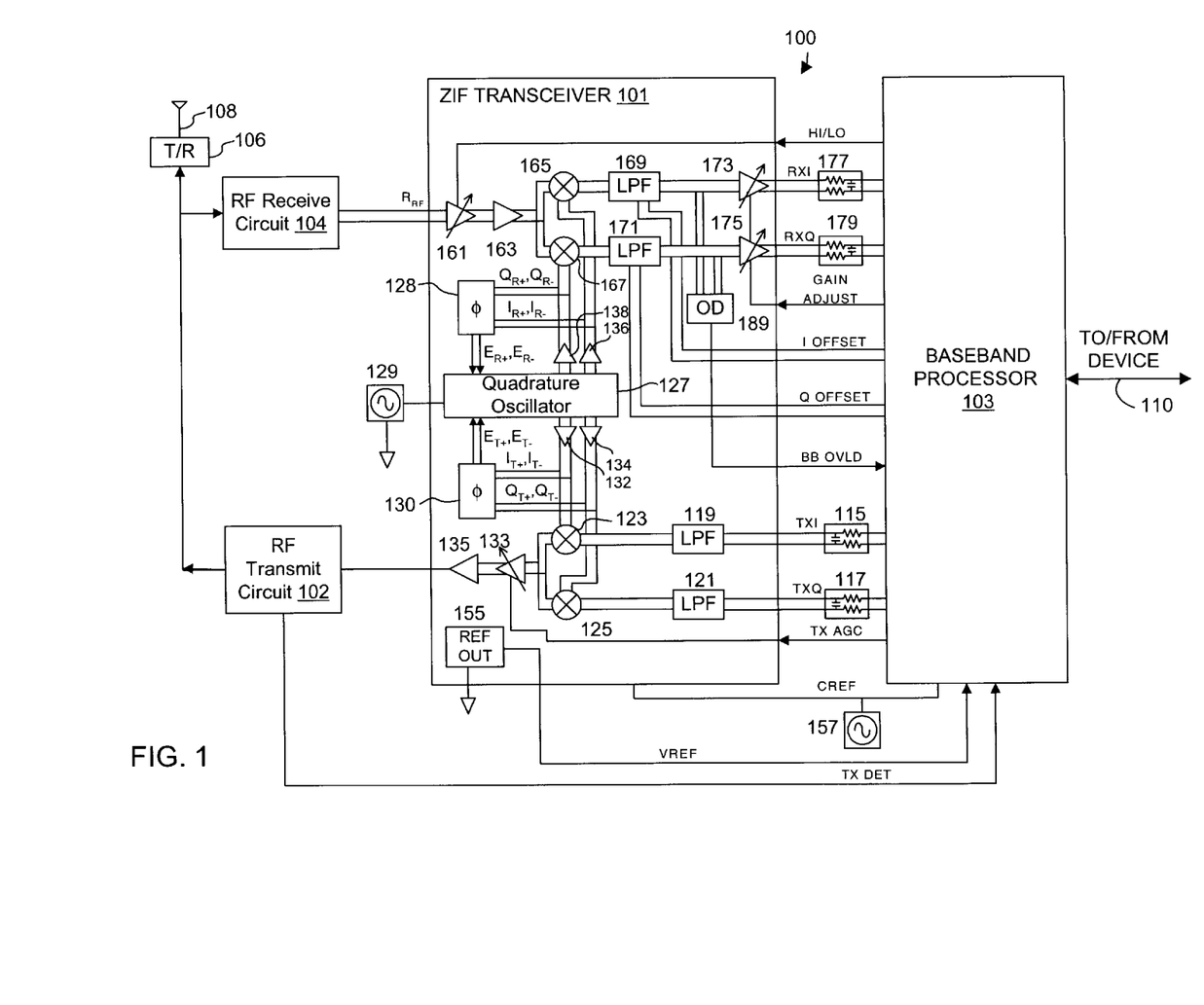
FIG. 1 is a simplified block diagram of an exemplary wireless transceiver implemented according to an embodiment of the present invention.

FIG. 1 is a simplified block diagram of an exemplary wireless transceiver 100 implemented according to an embodiment of the present invention. It is understood that the wireless transceiver 100 is applicable to WLAN configurations or any other type of radio or wireless communications for other types of applications. The wireless transceiver 100 is implemented as a zero intermediate frequency (ZIF) architecture including a ZIF transceiver 101, a baseband processor 103, a radio frequency (RF) transmit circuit 102, an RF receive circuit 104, a transmit/receive (T/R) switch 106, and an antenna 108. The ZIF architecture enables a simplified configuration by entirely eliminating intermediate frequency (IF) logic and associated circuitry. In this manner, only two primary modules, chips, or ICs (transceiver and processor) are utilized in the ZIF architecture to enable wireless communications. The ZIF transceiver 101 includes a quadrature oscillator 127 with phase error correction.

The wireless transceiver 100 may utilize any desired carrier frequency and modulation technique to achieve any of several corresponding data throughputs. For example, the wireless transceiver 100 may be configured to operate according to the Institute of Electrical and Electronics Engineers (IEEE) 802.11 b with a carrier frequency of approximately 2.4 gigahertz (GHz) and with data throughputs of 1, 2, 5.5 or 11 Megabits per second (Mbps). Alternatively, the wireless transceiver 100 may be configured according to IEEE 802.11a with a carrier frequency of approximately 5 GHz for data throughputs of 6, 12, 18, 24, 36 or 54 Mbps. In the embodiment shown, the wireless transceiver 100 operates in accordance with IEEE 802.11b at a carrier frequency of 2.4 GHz with data throughput rates of 1, 2, 5.5 or 11 Mbps. The direct sequence spread spectrum (DSSS) modulation technique is used in the embodiment shown, although it is understood that the present invention is not limited to any particular communication or modulation technique or standard.

The wireless transceiver 100 may be incorporated internally within a device, such as on a PC CARD or the like, or may be external with appropriate external connectors, such as according to USB or the like. Digital data sent from or received by the wireless transceiver 100 via an interface 110 is processed by the baseband processor 103. The baseband processor 103 includes a medium access control (MAC) device (not shown) that interfaces with the wireless device. For transmission, the baseband processor 103 further includes an encoder (not shown) that formulates the data into packets for transmission, and a spreading encoder (not shown) that uses a quadrature generation technique to provide in-phase (I) and quadrature phase (Q) signals on respective I and Q channels. The spreading decoder is configured in accordance with any one of various known spreading algorithms. The I and Q channel signals are provided to respective digital-to-analog converters (DACs) (not shown) that assert respective I and Q channel analog signals.

The I channel analog output signal from the baseband processor 103 is provided to an anti-aliasing low-pass filter (AA LPF) 115, which provides an I channel transmit signal TX1 to an LPF 119 within the ZIF transceiver 101. The baseband processor 103 asserts the Q channel analog output signal to another AA LPF 127, which provides a Q channel transmit signal TXQ to the input of another LPF 121 within the ZIF transceiver 101.

An external voltage controlled oscillator (VCO) 129 provides an output local oscillator (LO) signal at approximately 4.8–5 GHz to an input of the quadrature oscillator 127. In one embodiment, a reference crystal is used to tune the VCO 129 by a voltage control to generate the 4.8–5 GHz LO signal. The quadrature oscillator 127 divides the LO signal by two and generates four separate 2.4 GHz carrier signals, including two in-phase (I) carrier signals, and two receive quadrature (Q) carrier signals, each comprising a differential signal. In particular, the I carrier signals include a differential I transmit carrier signal ($I_{T+}$, $I_{T-}$) and an differential I receive carrier signal ($I_{R+}$, $I_{R-}$) and the Q carrier signals include a differential Q transmit carrier signal ($Q_{T+}$, $Q_{T-}$) and a differential Q receive carrier signal ($Q_{R+}$, $Q_{R-}$). The I and Q carrier signals are intended to be 90 degrees out of phase with respect to each other.

The I transmit carrier signal is provided to one input of an I channel mixer 123 through a driver 132, and the Q transmit carrier signal is provided to one input of a Q channel mixer 125 through another driver 134. The other input of the I channel mixer 123 receives the output of the LPF 119 and the other input of the Q channel mixer 125 receives the output of the LPF 121. The I channel mixer 123 combines the I carrier signal with the I channel transmit signal to up-convert the I channel from baseband to 2.4 GHz radio frequency (RF). The Q channel mixer 125 combines the Q carrier signal with the Q channel transmit signal to up-convert the Q channel from baseband to 2.4 GHz RF. The outputs of the I/Q channel mixers 123, 125 are combined at the input of a variable gain amplifier (VGA) 133. The VGA 133 asserts an amplified transmit signal to the input of a fixed-gain amplifier 135, which provides an output transmit signal to the RF transmit circuit 102. The RF transmit circuit 102 asserts an amplified RF signal to the antenna 108 through the T/R switch 106 when in a transmit mode.

A transmit detect (TX DET) feedback signal is asserted by the RF transmit circuit 102 back to the baseband processor 103. The baseband processor 103 conducts a power control algorithm that detects the transmitted output signal via the TX DET signal and provides a feed forward transmit automatic gain control (TX AGC) signal to the ZIF transceiver 101 to control the gain of the VGA 133. Further, the ZIF transceiver 101 includes a voltage reference source 155 that provides a voltage reference (VREF) signal for the ZIF transceiver 101 and for the baseband processor 103. The VREF signal may be any convenient voltage, such as 1.2 volts or the like. Also, a clock source 157 provides a clock reference (CREF) signal to the ZIF transceiver 101 and the baseband processor 103.

The T/R switch 106 is selected to receive signals from the antenna 108 when in a receive mode and to provide the received signal to the input of the RF receive circuit 104. The RF receive circuit 104 provides an RF input signal $R_{RF}$ to the inputs of a variable LNA 161 within the ZIF transceiver 101. The LNA 161 asserts its output to the input of a fixed-gain LNA 163. The LNA 163 asserts the amplified RF receive signal to respective inputs of an I channel mixer 165 and a Q channel mixer 167. The quadrature oscillator 127 asserts the I receive carrier signal ($I_{R+}$, $I_{R-}$) to another input of the I channel mixer 165 through a driver 136 and the Q receive carrier signal ($Q_{R+}$, $Q_{R-}$) to another input of the Q channel mixer 167 through another driver 138. The I channel mixer 165 splits the I carrier frequency from the I channel output signal in the RF receive signal and provides the I channel output signal to an LPF 169. In a similar manner, the Q channel mixer 167 splits the Q carrier frequency from the Q channel output signal in the RF receive signal and provides the Q channel output signal to an LPF 171.

The output of the LPF 169 is provided to the input of a variable baseband automatic gain control (BB AGC) amplifier 173. In a similar manner, the LPF 171 asserts its output to the input of another BB AGC amplifier 175. The BB AGC amplifier 173 asserts an amplified I channel analog receive signal (RXI) to the input of an I channel receiver AA LPF 177, which asserts its output to an I channel input of the baseband processor 103. The BB AGC amplifier 175 asserts an amplified Q channel analog receive signal (RXQ) to the input of a Q channel AA LPF 179, which provides its output to a Q channel input of the baseband processor 103. The baseband processor 103 includes analog-to-digital converters (ADCs) (not shown) that convert the analog RXI and RXQ signals to digital format. The baseband processor 103 further includes a spreading decoder (not shown) that retrieves encoded packets and a packet decoder (not shown) that retrieves the packet payloads from the packets and generates a stream of received data signals. The received data signals are provided to the MAC device, which provides the received data signals to a corresponding device across the interface 110.

An overload detector (OD) 189 within the ZIF transceiver 101 has first and second inputs coupled to the respective outputs of the LPF 169 and LPF 171 to detect an overload in the received input signal. The overload detector 189 asserts a baseband overload (BB OVLD) signal to a compensation system within the baseband processor 103. In this manner, the compensation system detects an overload of the received signal and asserts a HI/LO signal to control the variable LNA 161 of the ZIF transceiver 101. In the embodiment shown, the variable LNA 161 has an approximate 33 decibel (dB) step differential between a high gain (HI) and a low gain (LO). The gain is initially set high to detect weak signals and is switched to low gain upon certain conditions if the receive signal causes an overload condition as detected by the overload detector 189.

The compensation system also controls the gain of the received signal to a target power level by asserting an analog feedback gain control signal GAIN ADJUST to control the gain of both of the BB AGC amplifiers 173, 175. A single gain control signal is provided to both of the BB AGC amplifiers 173, 175 so that the gain of the I and Q channels of the receive signal appropriately track one another. The compensation system further asserts respective digital I and Q channel DC offset signals, I OFFSET and Q OFFSET to the LPF 169 and the LPF 171, respectively. In this manner, the compensation system attempts to measure and reduce or otherwise eliminate DC offsets in both the I and Q channels of the receive signal within the ZIF transceiver 101.

In the embodiment shown, a phase (φ) error detector 128 receives the differential Q receive carrier signal ($Q_{R+}$, $Q_{R-}$) and the differential I receive carrier signal ($I_{R+}$, $I_{R-}$) and generates a differential receive phase error signal $E_R$ with positive and negative components ($E_{R+}$, $E_{R-}$). Likewise, another phase error detector 130 receives the differential Q transmit carrier signal $Q_{T+}$, $Q_{T-}$) and the differential I receive carrier signal $I_{T+}$, $I_{T-}$) and generates a differential transmit phase error signal $E_T$ with positive and negative components $E_{T+}$, $E_{T-}$). Each phase error detector 128, 130 measures the relative phase error from quadrature between the corresponding differential I and Q carrier signals and converts the measured error to a phase error voltage, which is the DC component of the output signal of the phase error detector 128, 130. The phase error signals $E_R$ and $E_T$ are provided to the quadrature oscillator 127, which adjusts the I and Q carrier signals accordingly.

As described previously, the ZIF architecture of the wireless transceiver 100 enables a simplified configuration by entirely eliminating IF logic and associated circuitry. In this manner, the BB AGC amplifiers 173, 175 are DC coupled. It is desired that the AGC amplifiers 173, 175 have a relatively large maximum voltage gain and a relatively large total gain range capability. It is desired that the gain range of the AGC amplifiers 173, 175 be relatively matched across the two baseband channels I and Q. It is desired that the AGC amplifiers 173, 175 have relatively tight gain control across process variations and temperature ranges. It is desired that they have excellent low noise and linearity performance, and work with a limited supply voltage. It is desired that the AGC amplifiers 173, 175 be symmetrical and have well-controlled overdrive characteristics to support the digital control loop processing. It is also desired that the AGC amplifiers 173, 175 have low overall power dissipation.

Figure 2:
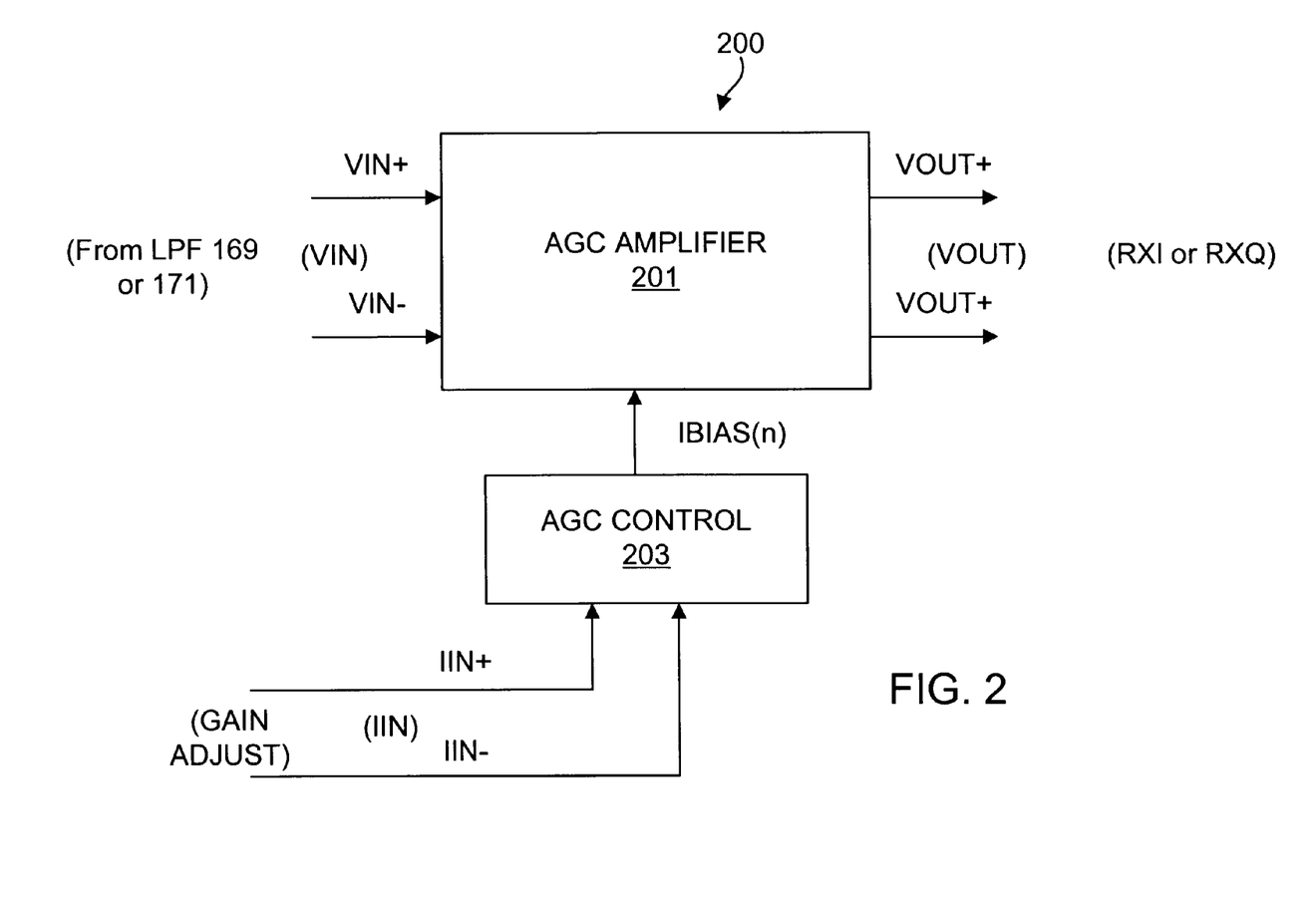
FIG. 2 is a simplified block diagram of an AGC amplifier system that may be utilized as either or both of the BB AGC amplifiers of FIG. 1.

FIG. 2 is a simplified block diagram of an AGC amplifier system 200 that may be utilized as either or both of the BB AGC amplifiers 173, 175. The AGC amplifier system 200 includes an AGC amplifier 201 and an AGC control block 203. The AGC amplifier 201 receives a differential input voltage VIN with positive and negative polarity signals VIN+ and VIN−. The AGC amplifier 201 provides a differential output voltage VOUT with positive and negative polarity signals VOUT+ and VOUT−. When employed within the ZIF transceiver 101, the VIN signal is asserted by either the LPF 169 or 171, and the AGC amplifier 201 asserts the VOUT signal as either the RXI or RXQ signals, accordingly. In the embodiment shown, the GAIN ADJUST signal is asserted by the baseband processor 103 as a differential current signal, which is provided to an AGC control block 103 as a differential current input signal IIN with positive and negative polarity signals IIN+ and IIN−. The AGC control block 203 asserts one or more bias control signals IBIAS(n), where n is a positive integer greater than zero.

Figure 3:
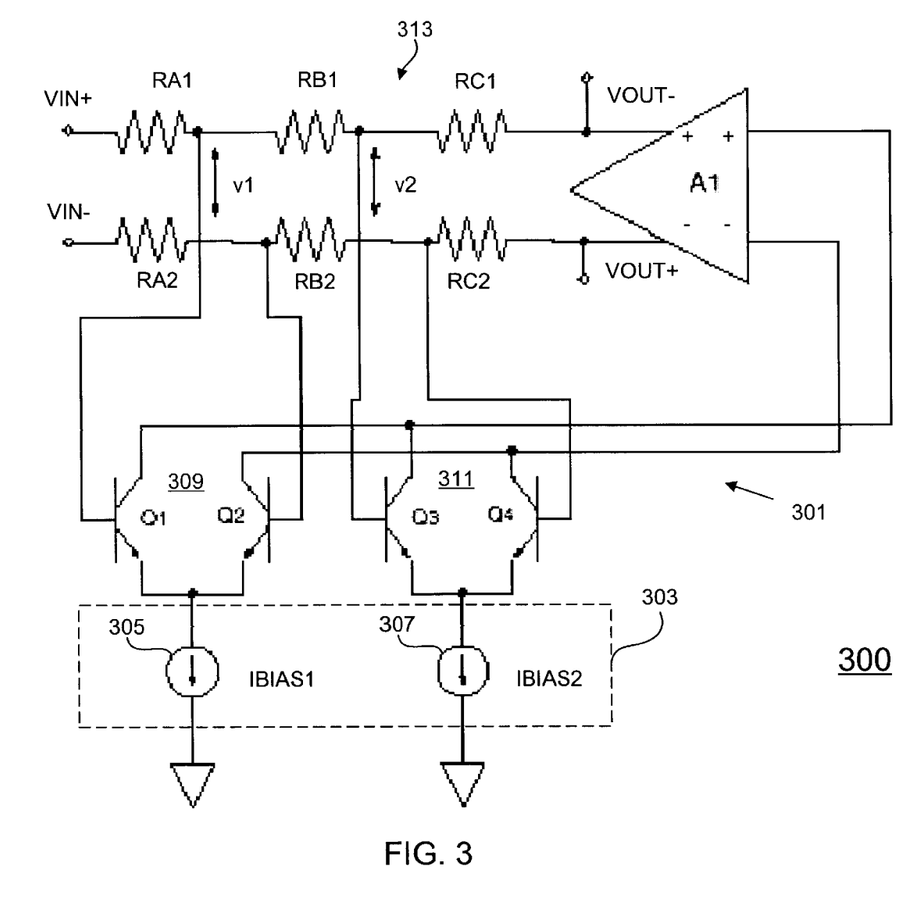
FIG. 3 is a schematic diagram of an exemplary AGC amplifier system that may be used as the AGC amplifier system of FIG. 2.

FIG. 3 is a schematic diagram of an exemplary AGC amplifier system 300 that may be used as the AGC amplifier system 200. The AGC amplifier system 300 includes an AGC amplifier 301 and a control circuit 303 corresponding to the AGC amplifier 201 and the AGC control block 203. The AGC amplifier 301 includes four NPN bipolar junction transistors (BJTs) Q1, Q2, Q3 and Q4, six feedback resistors RA1, RA2, RB1, RB2, RC1 and RC2, and a high gain transimpedance stage amplifier A1. The control circuit 303 is represented as two bias control current sinks 305 and 307, which generate bias currents IBIAS1 and IBIAS2, respectively.

The input signals VIN+, VIN− are provided to respective ends of the two resistors RA1 and RA2. The other end of the resistor RA1 is coupled to one end of the resistor RB1 and to the base of the transistor Q1. The other end of the resistor RB1 is coupled to one end of the resistor RC1 and to the base of the transistor Q3. The other end of the resistor RC1 is coupled to the non-inverting output of the amplifier A1, which generates the negative polarity signal VOUT−. The other end of the resistor RA2 is coupled to one end of the resistor RB2 and to the base of the transistor Q2. The other end of the resistor RB2 coupled to one end of the resistor RC2 and to the base of the transistor Q4. The other end of the resistor RC2 is coupled to the inverting output of the amplifier A1, which generates the positive polarity output signal VOUT+.

The collectors of the transistors Q1 and Q3 are coupled together and to the non-inverting input of the amplifier A1. The collectors of the transistors Q2 and Q4 are coupled together and to the inverting input of the amplifier A1. The emitters of the transistors Q1 and Q2 are coupled together and to one end of the current sink 305, having its other end coupled to ground or a negative supply signal. The emitters of the transistors Q3 and Q4 are coupled together and to one end of the current sink 305, having its other end coupled to ground or a negative supply signal. A differential voltage node v1 is defined across the bases of the transistors Q1 and Q2 and another differential voltage node v2 is defined across the bases of the transistors Q3 and Q4.

In this manner, the AGC amplifier system 300 has four component parts, including a pair of transconductance stages 309, 311 formed at the collectors of the transistor pairs Q1, Q2 and Q3, Q4, respectively, the amplifier A1, a resistive feedback network 313 including the resistors RA1–RC2 and a pair of control currents formed by the current sinks 305, 307. The outputs of the transconductance stages 309, 311 drive the inputs of the amplifier A1. The outputs of the amplifier A1 drive the resistive feedback network 313 coupled to both the inputs of the AGC amplifier 300 and the inputs of the transconductance stages 309, 311.

In operation, when the current sink 305 is turned on while the current sink 307 is turned off, and a positive input signal VIN+>VIN- is applied, the first transconductance stage 309 outputs a positive current in response. The second transconductance stage 311 is off and inactive and presents a high impedance that does not practically influence the operation. This positive input current from the first transconductance stage 309 is applied to the high gain transimpedance amplifier A1, which causes it to output a voltage. The reverse polarity or negative output of the amplifier A1 is connected through the resistive feedback network 313 to the input. It is noted that a polarity change occurs between the inputs and outputs of the transconductance stages 309 and 311. The transimpedance amplifier A1 does not invert the signal.

The gain of a feedback amplifier such as the AGC amplifier 301 can be defined in terms of the feedback resistors and a virtual ground. If a large number of very small value resistors are series connected in a string with one end of the resistor string connected to a positive voltage and the other end connected to a negative voltage, there exists a node within the resistor string that has a voltage of approximately zero. This zero voltage node is considered a "virtual ground" since it has the same potential as ground although it is not physically connected directly to ground. If this resistor string is the feedback network for a feedback amplifier, it can be shown that the closed loop voltage gain is equal to the ratio of the total resistance between the virtual ground node and the output divided by the total resistance between the virtual ground node and the input. With the transconductance stage 309 on and transconductance stage 311 off, the differential virtual ground is at the node v1. Likewise, with the transconductance stage 311 on and the transconductance stage 309 off, the differential virtual ground is at the node v2. The resistors RB1 and RB2 may be thought of as an infinite number of series-connected, infinitely small value resistors, so that with both of the transconductance stages 309 and 311 on, there exists a differential virtual ground between two nodes inside RB1 and RB2. The gain is then the sum of the resistors RC (RC1 and RC2) plus a fraction of resistors RB (RB 1 and RB2) divided by the sum of resistors RA (RA1 and RA2) and the other part of the resistor RB. In effect, it is as though the location of the virtual ground is forced to move from one end of each of the pair of resistors RB1 and RB2 to the other end. It is noted that the current sink 305 is turned on to turn on the transconductance stage 309 and that the current sink 307 is turned on to turn on the transconductance stage 311.

For RA=RA1=RA2, RB=RB1=RB2, and RC=RC1=RC2, the overall gain for this case is at a maximum and simplifies to (RB+RC)/RA. When the current sink 305 is off and the current sink 307 is on, the "virtual ground" moves to the v2 node in a similar manner as described above. The overall gain for this case is at a minimum and simplifies to RC/(RA+RB). It is noted that for these maximum and minimum gain cases, the gain is a ratio of the resistors RA–RC, which can be very precisely matched (e.g. 0.2%) in integrated circuit (IC) processing. Therefore, the gain is precisely controlled for these cases.

The final case is when both of the current sinks 305 and 307 of the control circuit 303 are on. For this case, the "virtual ground" is virtually positioned between the nodes v1 and v2, where the gain is between the maximum and minimum cases. The gain involves a resistive ratio as well as a transconductance ratio. Transconductance ratios become bias current ratios and can be precisely matched (e.g. <1%) in IC processing. Therefore, the gain is precisely controlled throughout the entire gain range. In summary, the AGC amplifier system 300 is in a negative feedback configuration in which its gain is varied by the control currents to the transconductance stages. Assuming that the base currents to the transconductance stages 309, 311 are negligible, the voltages at the v1 and v2 nodes are provided by the following equations 1 and 2:

$$v1=VIN[(RB+RC)/(RA+RB+RC)]+VOUT[(RA)/(RA+RB+RC)] \quad (EQ\ 1)$$

$$v2=VIN[(RC)/(RA+RB+RC)]+VOUT[(RA+RB)/(RA+RB+RC)] \quad (EQ\ 2)$$

where VIN=VIN+−VIN−, VOUT=VOUT+−VOUT−, RA=RA1=RA2, RB=RB1 =RB2, and RC=RC1=RC2.

The output voltage of the AGC amplifier 301 is a functions of v1 and v2 as illustrated by the following equation 3:

$$VOUT=RT[(v1)(gm1)+(v)(gm3)] \quad (EQ\ 3)$$

where RT is the transconductance of the amplifier A1, gm1=IBIAS1/VT and gm3=IBIAS3/VT, and where VT is a thermal coefficient voltage (the voltage equivalent of temperature: VT=kT/q, where "k" is the Boltzmann constant in joules per degree Kelvin, T is the temperature in degrees Kelvin (absolute scale), and "q" is the magnitude of the charge of an electron). The following equation 4 results by substituting equations 1 and 2 into the equation 3 to solve for the output voltage VOUT:

$$VOUT=-VIN\{[(gm1)(RB+RC)+(gm3)(RC)]/[(gm1)(RA)+(gm3)(RA+RB)]\} \quad (EQ\ 4)$$

The following equation 5 illustrates the output voltage to input voltage differential for the special case in which the total transconductance stage bias current is constant (i.e., IBIAS =IBIAS1+IBIAS2, gm=gm1+gm3, x=gm1/gm, gm3=(1−x)gm):

$$VOUT/VIN =-[RC+xRB]/[RA+(1-x)(RB)] \quad (EQ\ 5)$$

The following equations 6 illustrates these relationships in terms of gain (for x ranging between 0 and 1, inclusive):

$$VOUT/VIN=-[AL(AH+1)+x(AH-AL)]/[(AH+1)-x(AH-AL)] \quad (EQ\ 6)$$

where AH=(RC+RB)/RA and AL=RC/(RA+RB). Because x is in both the numerator and the denominator, the gain does not change linearly with x but it does increase monitonically with increasing x. If the difference between high and low gain is small, the gain changes linearly with x as illustrated by the following equation 7:

$$VOUT/VIN=AL+x(AH-AL) \quad (EQ\ 7)$$

where (AH+1)>>(AH−AL).

In general, the rate of change of gain increases as x approaches 1 because of the term in the denominator with reference to equation 6. This type of curvature is similar enough to an exponential that the gain in dB increases approximately linearly with increasing x. For the AGC amplifier 301, the resistor values define the gain at a finite number of points on the gain versus control signal curve, one point for each of the transconductance stages 309, 311. The shape of this gain curve between these fixed points depends upon how the transconductances change with the IBIAS(n) control signals. It is possible, for example, that the IBIAS(n) control signals can be utilized to modify the gain curve so that it is smoother between the breakpoints set by the values of the resistors RA–RC. It is contemplated that other useful proportions other than having the gain curve linear in dB can be achieved through proper modifications of the control signals.

The transconductance stages 309 and 311 are biased and otherwise controlled by the respective controlled current sinks 305 and 307 via the bias currents IBIAS1 and IBIAS2. Further, the transconductance stages 309 and 311 have differential inputs coupled to respective differential nodes v1 and v2, and differential outputs coupled to the differential inputs of the amplifier A1. As the IBIASI and IBIAS2 currents are changed, the virtual ground is moved between the nodes v1 and v2 and thus changes the gain of the AGC circuit 301. It is noted that the transconductance stages 309 and 311 virtually control the resistive feedback network 313 in a similar manner as variable resistors to change the feedback path and thus the gain.

In one embodiment, the corresponding resistors are matched (RA1=RA2=RA, RB1=RB2=RB and RC1=RC2=RC) and the ratio of the resistances RA, RB and RC are chosen to achieve the desired gain range. Of course, the resistances need not be matched to change the operating points of the AGC amplifier 301. The control circuit 303 may be configured as necessary to control the gain as desired. In one embodiment, the IBIAS1 and IBIAS2 currents are controlled so that their sum (IBIAS1+IBIAS2) is constant to achieve overall linearity, if desired.

Additional transconductance stages are employed for more practical implementations of the AGC amplifier system 300. As additional transconductance stages are included, the input signal levels impressed across each stage is lower because of the additional resistive attenuation. In this manner, the overall linearity of a resulting circuit can be better optimized. Optimal linearity, however, is achieved by controlling each of the transconductance stages individually so that only two are on at any given time.

Figure 4:
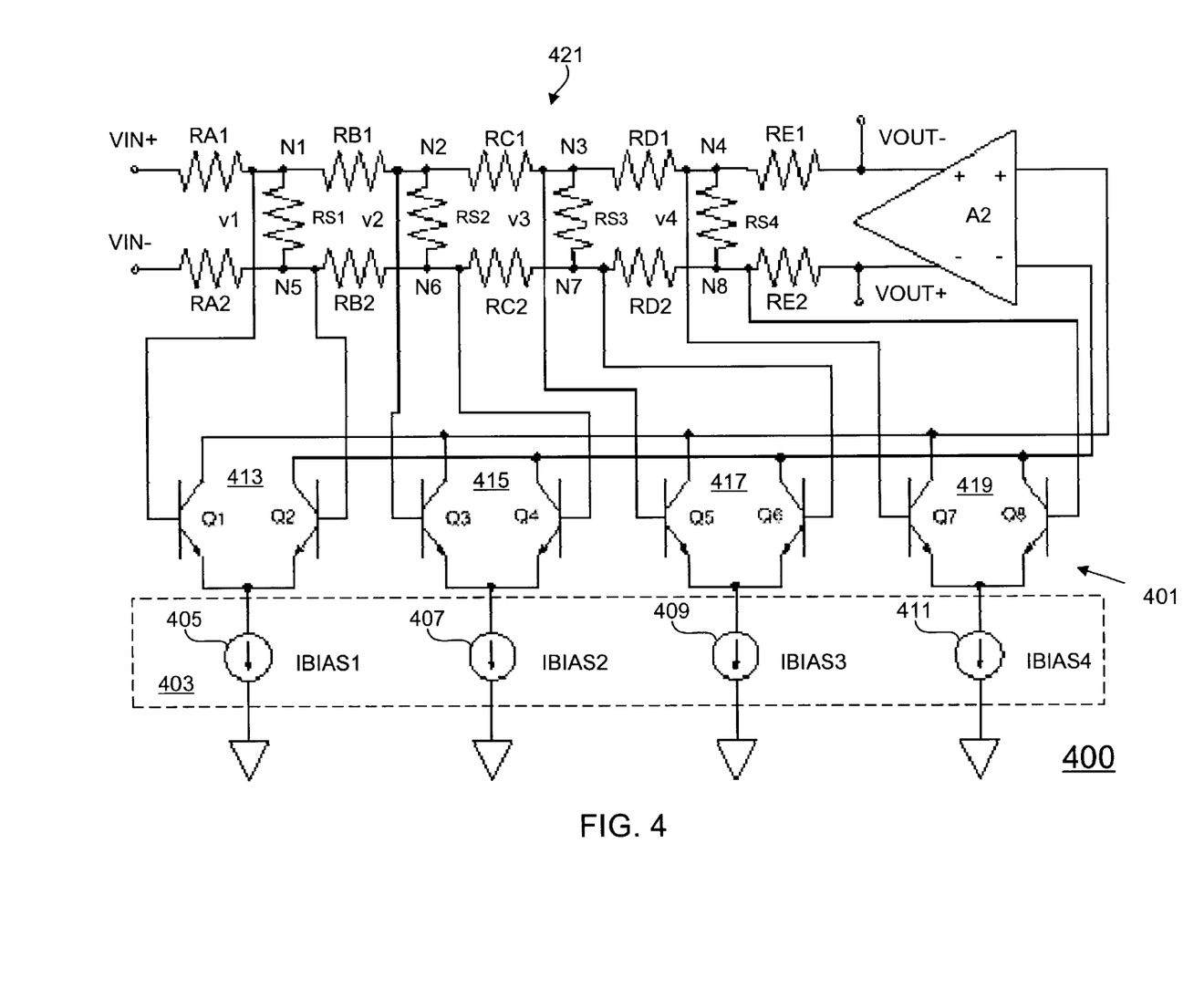
FIG. 4 is a schematic diagram of another exemplary AGC amplifier system that may be used as either or both of the BB AGC amplifiers of the wireless transceiver of FIG. 1.

FIG. 4 is a schematic diagram of another exemplary AGC amplifier system 400 that may be used as either or both of the BB AGC amplifiers 173, 175 of the wireless transceiver 100. The AGC amplifier system 400 is similar to the AGC amplifier system 300 and includes an AGC amplifier 401 and a control circuit 403 corresponding to the AGC amplifier 201 and the AGC control block 203. The AGC amplifier 401, however, includes additional stages and shunt resistors. The AGC amplifier 401 includes NPN BJTs Q1, Q2, Q3, Q4, Q5, Q6, Q7 and Q8 forming transconductance stages 413 (Q1 and Q2), 415 (Q3 and Q4), 417 (Q5 and Q6) and 419 (Q7 and Q8), multiple resistors RA1, RA2, RB1, RB2, RC1, RC2, RD1, RD2, and RE1, RE2, forming a resistive feedback network 421, shunt resistors RS1, RS2, RS3 and RS4 and a high gain transimpedance stage amplifier A2 that is similar to the amplifier A1. The control circuit 403 includes current sinks 405, 407, 409 and 411 that provide (or sink) currents IBIAS1, IBIAS2, IBIAS3 and IBIAS4, respectively.

The transistors Q1 and Q2 have their emitters coupled together and to the current sink 405, the transistors Q3 and Q4 have their emitters coupled together and to the current sink 407, transistors Q5 and Q6 have their emitters coupled together and to the current sink 409, and transistors Q7 and Q8 have their emitters coupled together and to the current sink 411. The other ends of the current sinks 405–411 are coupled to ground or to the negative supply signal. The collectors of the transistors Q1, Q3, Q5 and Q7 are coupled together and to the non-inverting input of the amplifier A2. Likewise, the collectors of the transistors Q2, Q4, Q6 and Q8 are coupled together and to the inverting input of the amplifier A2. The resistors RA1, RB1, RC1, RD1 and RE1 are coupled in series between the positive input polarity signal VIN+ and the non-inverting output of the amplifier A2, which develops the negative output polarity signal VOUT–. The junctions between these five resistors are nodes N1–N4 as shown. The resistors RA2, RB2, RC2, RD2 and RE2 are coupled in series between the negative input polarity signal VIN– and the inverting output of the amplifier A2, which develops the positive output polarity signal VOUT+. The junctions between these five resistors are nodes N5–N8 as shown. The nodes N1 and N5 are coupled to the bases of the transistors Q1 and Q2, respectively, forming a voltage node v1. The nodes N2 and N6 are coupled to the bases of the transistors Q3 and Q4, respectively, forming a voltage node v2. The nodes N3 and N7 are coupled to the bases of the transistors Q5 and Q6, respectively, forming a voltage node v3. The nodes N4 and N8 are coupled to the bases of the transistors Q7 and Q8, respectively, forming a voltage node v4.

The four shunt resistors RS1–RS4 are coupled between nodes N1 and N5, N2 and N6, N3 and N7 and N4 and N8, respectively. It is noted that the shunt resistors are optional but improve performance. In the embodiment shown, the shunt resistors are significantly larger than the other resistors, such as at least an order of magnitude larger. In a specific embodiment, the shunt resistors are on the order of 10K ohms whereas the feedback resistors are on the order of 1K ohms). It is noted, however, that the present invention is not limited to any particular size resistors or resistive ratios.

As with the AGC amplifier system 300, the four transconductance stages 413, 415, 417 and 419 are biased and otherwise controlled by the respective controlled current sinks 405, 407, 409 and 411. Further, the four transconductance stages 413, 415, 417 and 419 have differential inputs coupled to respective differential nodes v1, v2, v3 and v4, and differential outputs coupled to the differential inputs of the amplifier A2. As the IBIAS1–IBIAS4 currents are changed, the virtual ground is moved between the nodes v1–v4 and thus changes the gain of the AGC circuit 401. In one embodiment, the corresponding resistors are matched (RA1=RA2=RA, RB1=RB2=RB, RC1=RC2=RC, RD1=RD2=RD and RE1=RE2=RE) and the ratio of the resistances RA, RB, RC, RD and RE are chosen to achieve the desired gain range. Of course, the resistances need not be matched to change the operating points of the AGC amplifier 401. The control circuit 403 may be configured as necessary to control the gain as desired. In one embodiment, the IBIAS1–IBIAS4 currents are controlled so that their sum is constant to achieve overall linearity, if desired.

Figure 5A:
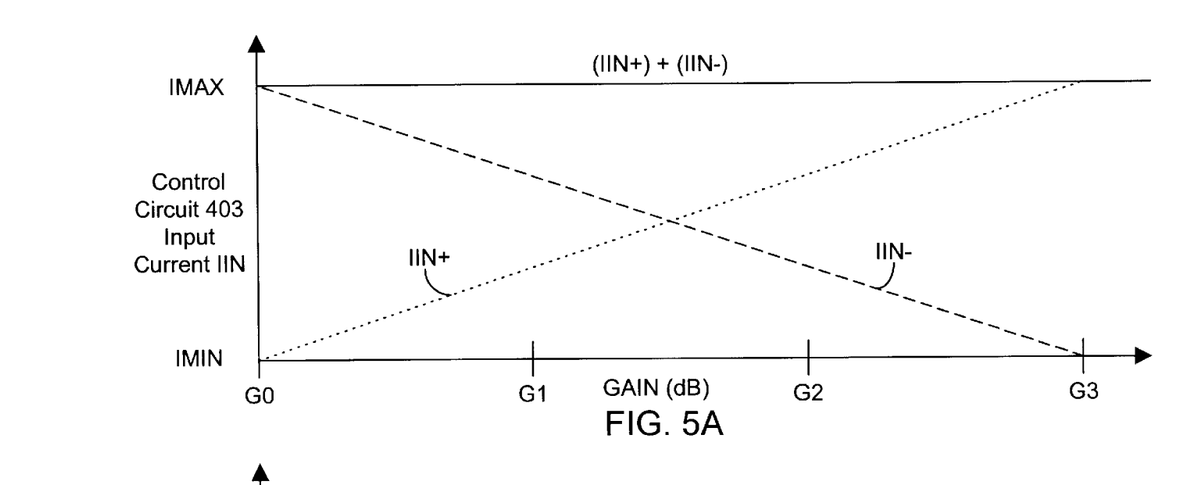
FIG. 5A is graph diagram of the input currents versus gain in dB for a particular configuration of the control circuit of FIG. 4.

FIG. 5A is graph diagram of the input currents IIN+, IIN– versus gain in dB for a particular configuration of the control circuit 403, such as when used as the BB AGC amplifiers 173, 175 within the wireless transceiver 100. The gain varies from a minimum GO to a maximum G3 and the current varies from a predetermined minimum IMIN to a predetermined maximum IMAX. The input currents may be, for example the outputs of a digital to analog converter (DAC) within the baseband processor 103 and are differential in the embodiment shown to improve isolation. It is noted, however, that single-ended signals are contemplated as well. The graph shows how the input currents vary across the gain range. When IIN+ is at IMAX and IIN− is at IMIN, the gain is at a predetermined maximum G3. When IIN− is at IMAX and IIN+ is at IMIN, the gain is at a predetermined minimum G0. In one embodiment, IMIN is zero and the sum of the two input current polarities (IIN++IIN−) is constant (IMAX) throughout the gain range G0 to G3.

Figure 5B:
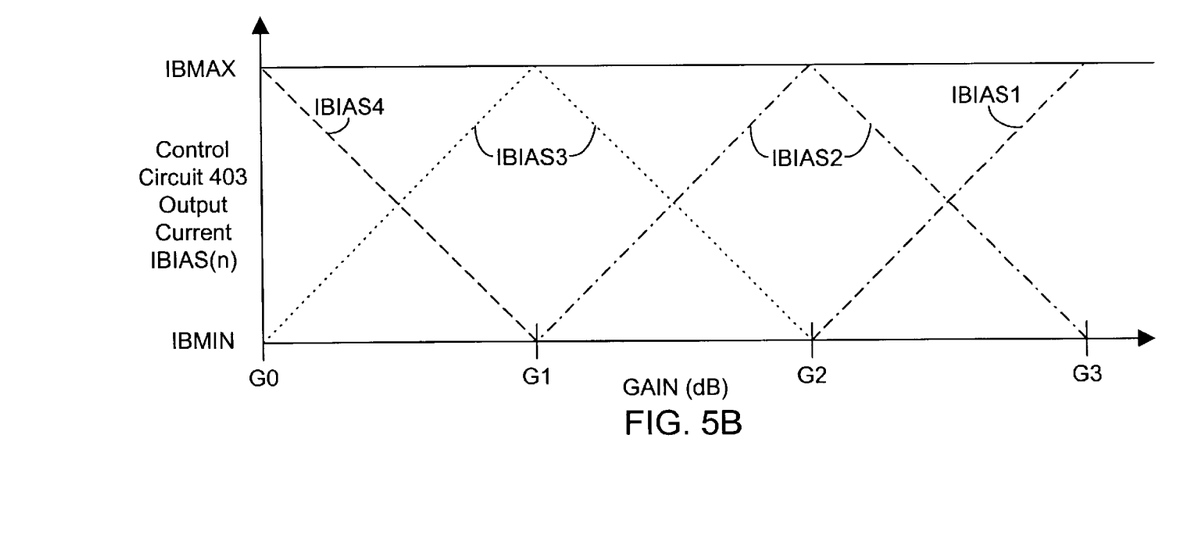
FIG. 5B is a graph diagram of the bias currents IBIAS1, IBIAS2, IBIAS3 and IBIAS4 plotted versus gain in dB for the control circuit of FIG. 4 corresponding to the graph of FIG. 5A.

FIG. 5B is a graph diagram of the bias currents IBIAS1, IBIAS2, IBIAS3 and IBIAS4 plotted versus gain in dB for the control circuit 403 corresponding to the graph of FIG. 5A. The curve shows how the output IBIAS(n) currents vary across the gain range between a predetermined minimum IBMIN and a predetermined maximum (IBMAX) in order to implement a control where only two current sinks are on at a time and the sum of all currents is always constant. The IBIAS curves are ramp or triangle waveforms which meet the criteria that only two are on at a time and where the sum of all their currents is constant (IBMAX).

In one embodiment, IBMIN is zero and the sum of the bias currents IBIAS1, IBIAS2, IBIAS3 and IBIAS4 is constant and equal to IBMAX at any given time through the gain range from G0 to G3. For the maximum gain G3, the current sink 405 (and the transconductance stage 413) is on with the bias current IBIAS 1 equal to IBMAX and the remaining current sinks 407–411 (and transconductance stages 415–419) are turned off. In this case, a "virtual ground" exists at the base inputs of Q1, Q2 at v1. Since a minimal voltage swing exists, gain linearity is excellent. Gain is decreased by linearly increasing the current of the next current sink 407 (and the transconductance stage 415) and linearly decreasing the current of the current sink 405. As the IBIAS2 current is linearly increased, the IBIAS1 current of the current sink 405 is linearly decreased so that the total bias current IBIAS remains constant at IBMAX. The "virtual ground" moves from v1 to being between the nodes v1 and v2.

When IBIAS2 becomes equal to IBMAX at gain G2, so that the current sink 407 (and the transconductance stage 415) is fully on and the bias currents IBIAS1, IBIAS3, IBIAS4 are zero (and where the transconductance stages 413, 417 and 419) and are off and the "virtual ground" is at v2. Again, gain linearity is excellent. Then, the current sink 409 (and the transconductance stage 417) begins to turn on thereby linearly increasing the bias current IBIAS3, whereas the current sink 407 (and the transconductance stage 415) begins to turn off linearly thereby decreasing IBIAS2, so that the total bias current remains constant at IBMAX. When IBIAS3 becomes equal to IBMAX at gain G1 (current sink 409 and transconductance stage 417 fully on), the bias current IBIAS2 is zero and the transconductance stages 413, 415 and 419 are off and the "virtual ground" is at v3. Again, gain linearity is excellent. Then, the current sink 411 and the transconductance stage 419 begin to turn on thereby linearly increasing the bias current IBIAS4, whereas the current sink 409 and the transconductance stage 417 begin to turn off thereby linearly decreasing IBIAS3 so that the total bias current remains constant at IBMAX. The sequence continues in the same manner until the current sink 411 and the transconductor stage 419 are on and the current sinks 405–409 and transconductance stages 413–417 are off and IBIAS4 equals IBMAX at the minimum gain G0. The virtual ground at gain G0 has moved to v4. It is noted that during the entire sequencing from gain G3 to gain G0, only two current sinks, and the corresponding transconductance stages, are on at a time, so that the output and the overall linearity is maintained at a maximum level and improved as compared to activating more than two stages at a time.

Any number of transconductance stages may be used where the practical limit is only the cost of the silicon area required. It is also expected that multiple stages of amplifiers, each similar to the AGC amplifier system 400, may be cascaded to cover any desired dynamic range. Other types of transistors may replace the BJTs in the transconductance stages, such as metal oxide semiconductor field effect transistors (MOSFETs) or the like. MOSFET's, however, do not have the same transconductance as BJT's, so that modifications to the control currents may be necessary to achieve maximal performance and linearity. It is noted that IBMAX may be set to any value. When used for the ZIF transceiver 101, a particularly convenient and efficient value is IBMAX is equal to the sum of the input current polarity signals (IIN++IIN−).

FIGS. 6A–6D are schematic diagrams of current control circuits 601, 603, 605 and 607, respectively, that may be used within the control circuit 403 to generate the bias currents IBIAS1–IBIAS4 in accordance with the curves illustrated in FIG. 5B. The control circuits 601–607 operate such that only two transconductance stages 413–419 are on at a time and the overall sum of the IBIAS currents are constant. It is noted, however, that these circuits represent only one embodiment of the present invention, where it is understood many different types and configurations of the control circuit 403 may be employed for controlling the AGC circuit 401. In addition, it should be noted that the control circuits 601–607 could be useful not only in this AGC circuit, but in general for analog IC applications.

Each of the control circuits 601–607 include four P-channel MOSFETs labeled MP3, MP4, MP5 and MP6 coupled in a similar manner. However, the relative size of the transistors is varied depending upon the particular function desired. For each control circuit 601–607, each of the transistors MP3–MP6 has its source coupled to a voltage supply signal VSUPPLY. The gates of the transistors MP3 and MP4 are coupled together and the gates of the transistors MP5 and MP6 are coupled together. The gates of the transistors MP3 and MP4 are coupled to the drain of the transistor MP4 and the gates of the transistors MP5 and MP6 are coupled to the drain of the transistor MP6. The drain of the transistor MP4 is coupled to the drain of the transistor MP5.

Figure 6A:
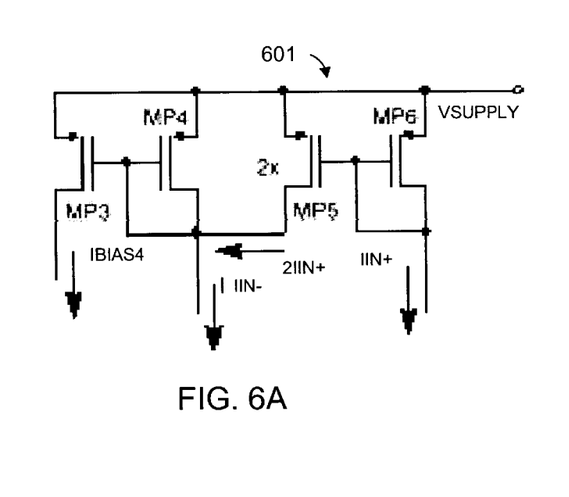
FIGS. 6A–6D are schematic diagrams of current control circuits that may be used within the control circuit of FIG. 4 to generate the bias currents IBIAS1–IBIAS4 in accordance with the curves illustrated in FIG. 5B.

For the control circuit 601, the transistors MP3 and MP4 have substantially equal sizes whereas the transistor MP5 is 2× or twice the size of the transistor MP6. The relative size of the transistors MP3 and MP4 is independent of the sizes of the transistors MP5 and MP6. The IIN+signal is applied to the drain of the transistor MP6 and the IIN−signal is applied to the drains of the transistors MP4 and MP5. In this manner, a current 2 IIN+ flows from the drain of the transistor MP5. The drain of the transistor MP3 provides the IBIAS4 current where IBIAS4=[(IIN−)−(2IIN+)] when IIN− is greater than or equal to 2 IIN+. When IIN− is less than 2 IIN+, IBIAS4 =0. This is the desired function of IBIAS4.

Figure 6B:
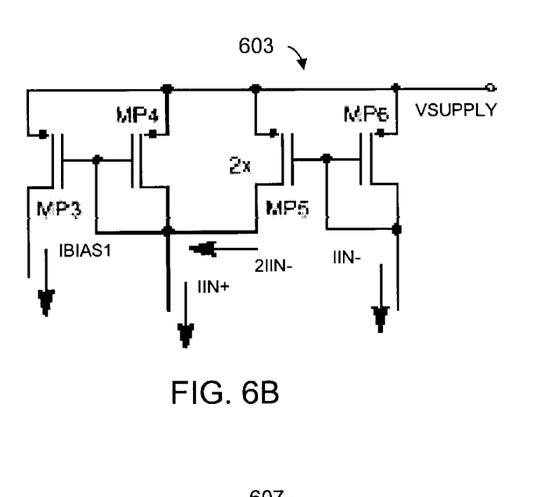

For the control circuit 603, the transistors MP3, MP4 and MP6 again have substantially equal sizes and the transistor MP5 is again 2× the size of the other transistors. In this case, however, the IIN− signal is applied to the drain of the transistor MP6 and the IIN+ signal is applied to the drains of the transistors MP4 and MP5. In this manner, a current 2

IIN− flows from the drain of the transistor MP5. The drain of the transistor MP3 provides the IBIAS1 current where IBIAS1=[(IIN+)−(2IIN−)] when IIN+ is greater than or equal to 2 IIN−. When IIN+ is less than 2 IIN−, IBIAS1=0. This is the desired function of IBIAS1.

Figure 6C:
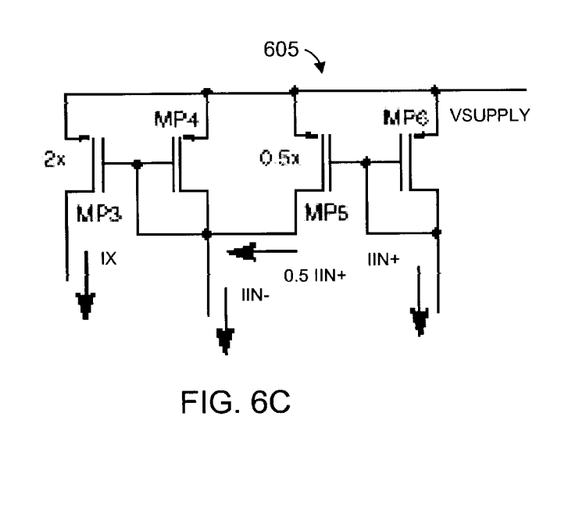

For the control circuit 605, the transistors MP3, MP4 and MP6 again have substantially equal sizes. In this case, the transistor MP5 is 0.5× or one-half the size of the other transistors. The IIN+ signal is applied to the drain of the transistor MP6 and the IIN− signal is applied to the drains of the transistors MP4 and MP5. In this manner, a current 0.5IIN+ flows from the drain of the transistor MP5. The drain of the transistor MP3 provides a current IX, where IX=[(2 IIN−)−(IIN+)] when IIN− is greater than or equal to 0.5IIN+. When IIN− is less than 0.5 IIN+, the current IX =0. The IX current is not directly used but instead is used to develop the IBIAS2 current. In particular, the IBIAS1 and the IX currents are subtracted from the total input current IO=[(IIN+)+(IIN−)]. Thus, IBIAS2=IO−IX−IBIAS1.

Figure 6D:
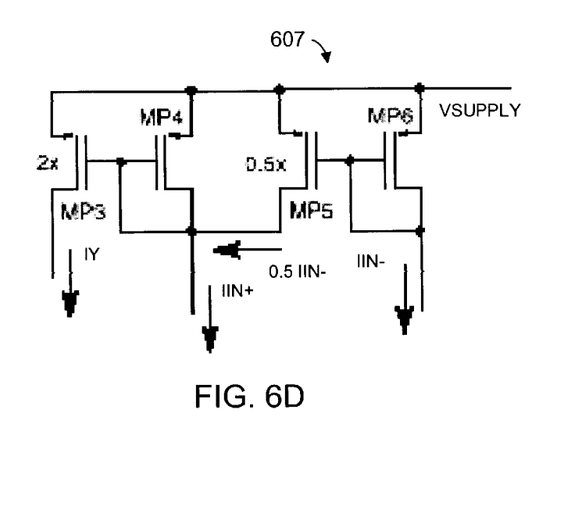

For the control circuit 607, the transistors MP3, MP4 and MP6 again have substantially equal sizes and the transistor MP5 is 0.5× the size of the other transistors. The IIN− signal is applied to the drain of the transistor MP6 and the IIN+ signal is applied to the drains of the transistors MP4 and MP5. In this manner, a current 0.51IN−flows from the drain of the transistor MP5. The drain of the transistor MP3 provides a current IY, where IY=[(2 IIN+)−(IIN−)] when IIN+ is greater than or equal to 0.51 IN−. When IIN+ is less than 0.5 IIN−, the current IY=0. The IY current is not directly used but instead is used to develop the IBIAS3 current. In particular, the IBIAS4 and the IY currents are subtracted from the total input current IO, so that IBIAS3=IO−IY−IBIAS4.

Figure 7:
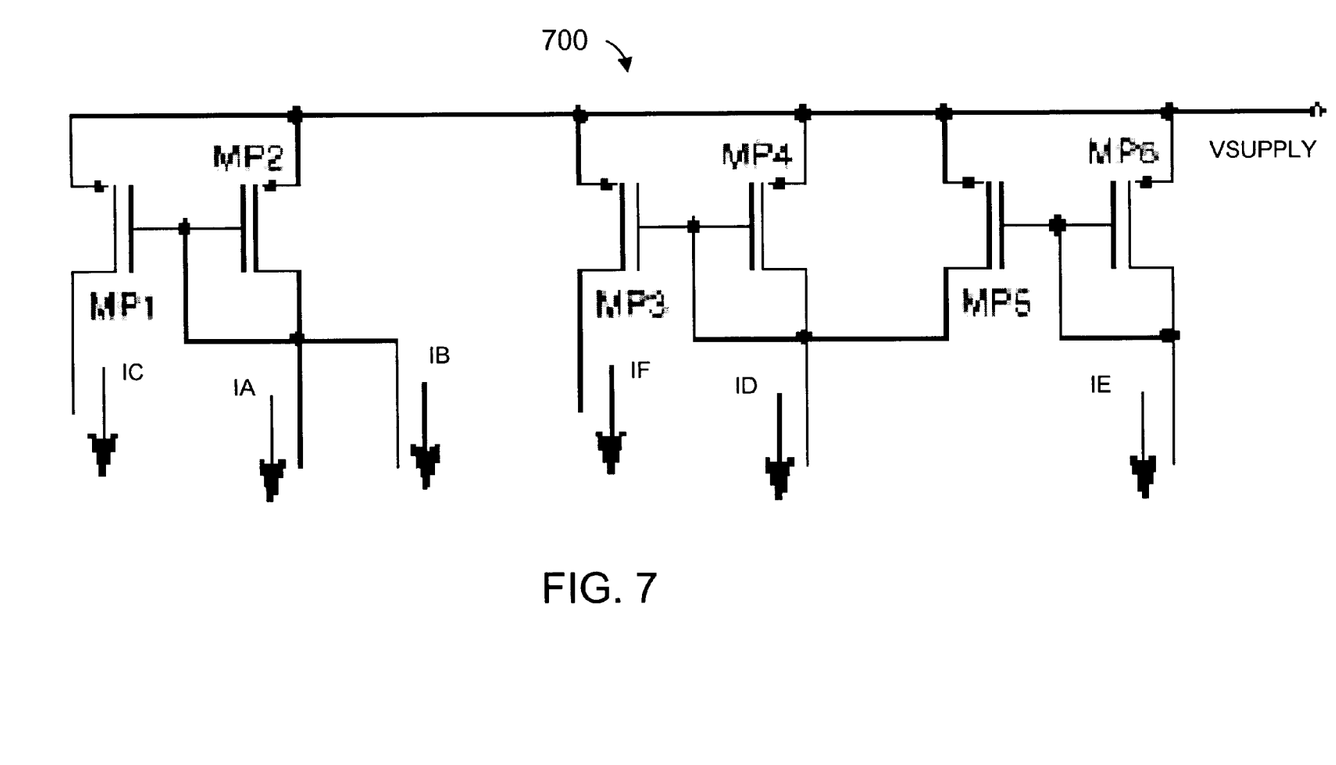
FIG. 7 is a schematic diagram of an exemplary summing and differencing circuit that may be used with the control circuits of FIGS. 6A–6D to develop bias currents.

FIG. 7 is a schematic diagram of an exemplary summing and differencing circuit 700 that may be used to develop the IBIAS2 and IBIAS3 currents. The summing and differencing circuit 700 includes six MOSFETs MP1–MP6. The transistors MP3–MP6 are coupled in a similar manner as described above for the control circuits 601–607 forming a differencing circuit, except that the sizes of the transistors MP3–MP6 are equal. A current ID is coupled at the drains of the transistors MP4 and MP5 and a current IE is coupled to the drain of the transistor MP6. A differencing current IF is developed at the drain of the transistor MP3, so that IF=ID−IE when ID is greater than or equal to IE. When ID is less then IE, IF=0.

The transistors MP1 and MP2 are coupled into a summing configuration having their sources coupled to the VSUPPLY signal and their gates coupled together. The gates of the transistors MP1 and MP2 are also coupled to the drain of the transistor MP2 for developing a summing node for currents IA and IB. The drain of the transistor MP1 develops a current IC that is the sum of the currents IA and IB. In this manner, a first summing circuit is employed to achieve IO where IA=IIN+ and 1B=IIN− so that IC=IO. Likewise, a second summing circuit is employed to sum the currents IX and IEBIAS1 where IA=IX and IB=IBIAS1 so that IC=IJ=(IX+IBIAS1). Then, the differencing circuit is employed to develop IBIAS2, where ID=IO and IE=IJ so that IF =IO−IJ=IO−IX−IBIAS1. Also, a third summing circuit is employed to sum the currents IY and IBIAS4 where IA=IY and IB=IBIAS4 so that IC=IK=(IY+IBIAS4). Then, another differencing circuit is employed to develop IBIAS3, where ID=IO and IE=IK so that IF=I0−IK=IO−IY−IBIAS4.

NMOS transistors can be substituted for the PMOS transistors shown in all the control circuits. The exemplary control circuits shown are for an AGC with four transconductance stages. This control circuit configuration may be increased or reduced as needed for more or less transconductance stages. The control functions change as necessary and could be derived in a similar manner as shown for the four control current case. Also, if multiple AGC circuits are cascaded, the IBIAS outputs are easily increased (use multiple transistors for each output) to control these additional AGC circuits. These control circuits are current mode, where the voltage excursions at internal nodes are minimal as the currents change dynamically. For this reason, these control circuits have very fast switching response which is a desirable feature to achieve a fast closing AGC system. BJT transistors may also be substituted for the PMOS transistors shown in the control circuits. BJT's, however, may exhibit long recovery times when they saturate, as would happen in the differencing circuits under some conditions. If the saturation recovery of BJT's are not a concern, or if clamping circuits are used to limit or eliminate the saturation condition, BJT's are an acceptable alternative.

Simulations of AGC amplifiers described herein illustrate that the variation is minimal over the desired gain range. The absolute gain variation was <1 db. Histograms of the amplitude balance have demonstrated less than 0.1 db difference between two such AGC circuits. This means two AGC circuits at maximum gain (such as 62 db) will have the same gain to within 0.1 db across multiple process runs of silicon.

It is noted that the ZIF architecture of the wireless transceiver 100 requires an AGC function which has a relatively large maximum voltage gain (such as 1000 V/V in an exemplary embodiment) and a relatively large total gain range capability (such as 66 db in the exemplary embodiment). Further, the gain range should match across the two baseband channels (I and Q) precisely, such as within 0.1 db of each other. In order to facilitate a fast response digital control loop which sets the AGC, it is desired that the AGC have absolute gain control to +/−1 db across process variations and temperature. The AGC is DC coupled, should have low noise and high linearity performance, and work with a limited voltage supply (such as 2.7 V in the exemplary embodiment). Additional requirements are contemplated, such high symmetry and well-controlled overdrive characteristics (to support digital control loop processing in the exemplary embodiment) and low overall power dissipation. The precision AGC circuit described herein achieved all these requirements.

Although a system and method according to the present invention has been described in connection with one or more embodiments, it is not intended to be limited to the specific form set forth herein, but on the contrary, it is intended to cover such alternatives, modifications, and equivalents, as can be reasonably included within the spirit and scope of the invention as defined by the appended claims.

What is claimed is:

1. An automatic gain control (AGC) amplifier, comprising:

a high gain amplifier having an input and an output, the output asserting an output signal of the AGC amplifier;

a feedback network having a first end receiving an input signal of the AGC amplifier, a second end coupled to the output of the high gain amplifier and a plurality of intermediate nodes; and a plurality of amplifier stages, each having an input coupled to a respective one of the plurality of intermediate nodes of the feedback network and an output coupled to the input of the high gain amplifier;

wherein at least one of the plurality of amplifier stages is independently controllable to position a virtual ground within the feedback network to control closed loop gain of the AGC amplifier.

2. The AGC amplifier of claim 1, wherein the high gain amplifier is a transimpedance amplifier.

3. The AGC amplifier of claim 1, wherein each of the plurality of amplifier stages comprises a transconductance stage.

4. The AGC amplifier of claim 3, wherein each of the plurality of transconductance stages includes a controllable bias current device, and wherein gain of the AGC amplifier is controlled by a transconductance ratio.

5. The AGC amplifier of claim 1, wherein the feedback network comprises a plurality of resistors coupled in series between the input signal and the output signal and having at least two intermediate junctions, and wherein gain of the AGC amplifier is defined by a resistive ratio of resistors in the feedback network.

6. The AGC amplifier of claim 1, further comprising:
the high gain amplifier comprising a differential amplifier having a differential input and a differential output that asserts a differential output signal;
the feedback network having a differential input for receiving a differential input signal and a differential output coupled to the differential output of the high gain amplifier and a plurality of intermediate differential nodes; and
the plurality of amplifier stages each having a differential input coupled to a respective one of the plurality of intermediate differential nodes of the feedback network and a differential output coupled to the differential input of the high gain amplifier.

7. The AGC amplifier of claim 6, wherein each of the plurality of amplifier stages comprises:
a differential pair of bipolar transistors having a common-coupled pair of emitters, a pair of bases forming the differential input and a pair of collectors forming the differential output; and
a controllable bias current device coupled to the common-coupled pair of emitters of the differential pair of bipolar transistors.

8. The AGC amplifier of claim 6, wherein the feedback network comprises:
a first set of resistors coupled in series between a first polarity of the differential input signal and a first polarity of the differential output of the high gain amplifier and having a first plurality of intermediate nodes; and
a second set of resistors coupled in series between a second polarity of the differential input signal and a second polarity of the differential output of the high gain amplifier and having a second plurality of intermediate nodes;
wherein the first and second plurality of intermediate nodes forms first and second polarities of the plurality of intermediate differential nodes.

9. The AGC amplifier of claim 8, further comprising a plurality of shunt resistors, each shunt resistor coupled between first and second polarities of a corresponding one of the plurality of intermediate differential nodes.

10. The AGC amplifier of claim 1, further comprising:
each of the plurality of amplifier stages having a bias terminal; and
a control circuit that develops a plurality of bias currents, each bias current developed at a corresponding bias terminal of the plurality of amplifier stages.

11. The AGC amplifier of claim 10, wherein the plurality of bias currents of the control circuit are controlled to vary the gain of the AGC amplifier.

12. The AGC amplifier of claim 11, wherein the control circuit is configured to vary gain of the AGC amplifier exponentially.

13. The AGC amplifier of claim 11, wherein a collective sum of the plurality of bias currents of the control circuit is maintained at a constant level while varying the gain of the AGC amplifier.

14. The AGC amplifier of claim 13, wherein the control circuit asserts up to two bias currents at any given time throughout a predetermined gain range.

15. The AGC amplifier of claim 14, wherein a first bias current is linearly increased between a minimum current level and a maximum current level while a second bias current is linearly decreased between the minimum current level and the maximum current level to vary the gain of the AGC amplifier.

16. The AGC amplifier of claim 15, wherein gain of the AGC amplifier is varied from a first gain level to a second gain level by linearly increasing a first bias current from a minimum current level to a maximum current level while linearly decreasing a second bias current from the maximum current level to the minimum current level, and wherein gain of the AGC amplifier is varied from the second gain level to a third gain level by linearly decreasing the second bias current from the maximum current level to the minimum current level while linearly increasing a third bias current from the minimum current level to the maximum current level.

17. The AGC amplifier of claim 10, wherein the control circuit receives a differential control input current and includes a plurality of current summing and differencing circuits to develop the plurality of bias currents.

18. An integrated circuit (IC), comprising:
at least one input terminal for receiving an input signal;
at least one output terminal for providing an output signal;
at least one control terminal for receiving a gain adjust signal; and
an automatic gain control (AGC) amplifier incorporated onto the IC, the AGC amplifier having an input and an output coupled in a processing path between the input and output terminals of the IC and having a control input coupled to receive the gain adjust signal, the AGC amplifier comprising:
a high gain amplifier having an input and an output, the output providing the output of the AGC amplifier;
a feedback network having a first end receiving an input signal of the AGC amplifier, a second end coupled to the output of the high gain amplifier and a plurality of intermediate nodes; and
a plurality of feedback amplifier stages, each feedback amplifier stage having an input coupled to a respective one of the plurality of intermediate nodes of the feedback network, an output coupled to the input of the high gain amplifier, and a control input; and
a gain control circuit having an input for receiving the gain adjust signal and a plurality of bias control outputs, each bias control output coupled to a control input of a corresponding one of the plurality of feedback amplifier stages, wherein the gain control circuit asserts a bias signal at each control input of the plurality of feedback amplifier stages to position a virtual ground within the feedback network to control closed loop gain of the AGC amplifier based on the gain adjust signal.

19. The IC of claim 18, wherein the IC is configured as a radio frequency (RF) communication chip, further comprising:
an input amplifier circuit having an input coupled to the IC input terminal for receiving an RF receive signal and having an output that asserts an amplified RF signal;
an oscillator circuit that asserts a carrier signal;
a mixer circuit, having a first input coupled to receive the carrier signal and a second input coupled to receive the amplified RF signal, the mixer circuit having an output for asserting a mixed channel signal;
a filter circuit having an input coupled to the output of the mixer circuit and an output for asserting a baseband channel signal; and
the input of the AGC amplifier coupled to the output of the filter circuit for receiving and amplifying the baseband channel signal.

20. The IC of claim 18, further comprising:
the oscillator circuit asserting an in-phase carrier signal and a quadrature carrier signal;
the mixer circuit including a first mixer and a second mixer, the first mixer receiving the in-phase carrier signal and asserting an in-phase mixed channel signal, and the second mixer receiving the quadrature carrier signal and asserting a quadrature mixed channel signal;
the filter circuit comprising a first low-pass filter coupled to the output of the first mixer for filtering the in-phase mixed channel signal to develop an in-phase channel signal and a second low-pass filter coupled to the output of the second mixer for filtering the quadrature mixed channel signal to develop a quadrature channel signal;
the AGC amplifier including a first AGC amplifier and a second AGC amplifier, the first AGC amplifier receiving and amplifying the in-phase channel signal and asserting a first amplified in-phase channel signal on a first output terminal of the IC, the second AGC amplifier receiving and amplifying the quadrature channel signal and asserting a second amplified in-phase channel signal on a second output terminal of the IC, the first second AGC amplifiers each having a plurality of control inputs coupled to the plurality of bias control outputs of the gain control circuit.

21. The IC of claim 20, wherein the IC comprises a zero-intermediate frequency transceiver.

22. The IC of claim 20, the in-phase and quadrature baseband signals both comprising differential signals, the first and second AGC amplifiers each comprise:
the high gain amplifier comprising a differential amplifier having a differential input and a differential output that asserts a differential output signal;
the feedback network having a differential input for receiving a differential input signal and a differential output coupled to the differential output of the high gain amplifier, the plurality of intermediate nodes each comprising an intermediate differential node; and
the plurality of amplifier stages each having a differential input coupled to a respective one of the plurality of intermediate differential nodes of the feedback network and a differential output coupled to the differential input of the high gain amplifier.

23. The IC of claim 22, further comprising:
the plurality of amplifier stages each comprising a transconductance stage with a bias current input; and
the gain control circuit developing a plurality of bias currents, each bias current applied to a bias current input of a corresponding one of the plurality of transconductance stages, wherein the gain control circuit controls the plurality of bias currents based on the gain adjust signal to vary transconductance of each transconductance stage to control the gain of the first and second AGC amplifiers.

24. The IC of claim 23, wherein the gain control circuit asserts up to two bias currents at any given time throughout a predetermined gain range, wherein the gain control circuit implements a ramp function for each of the plurality of bias currents in which each bias current is linearly varied between a minimum current level and a maximum current level, and wherein a sum of the asserted bias currents is maintained at a constant level.

25. A gain control circuit for an automatic gain control (AGC) amplifier, the AGC amplifier including a high gain differential amplifier having a differential input and a differential output and a differential feedback network coupled to the differential output of the differential amplifier and having a plurality of intermediate differential nodes, the gain control circuit comprising:
a plurality of transconductance stages, each transconductance stage having a differential input for coupling to a respective one of the plurality of intermediate differential nodes of the feedback network, a differential output for coupling to the differential input of the high gain differential amplifier, and a bias control input; and
a control circuit having an input for receiving the gain adjust signal and a plurality of bias control outputs, each bias control output coupled to a control input of a corresponding one of the plurality of transconductance stages, wherein the control circuit asserts a bias signal at each control input to position a virtual ground within the feedback network to control closed loop gain of the AGC amplifier based on the gain adjust signal.

26. The gain control circuit of claim 25, wherein the control circuit is configured so that a collective sum of asserted bias currents remains substantially constant while varying the gain of the AGC amplifier throughout a predetermined gain range.

27. The gain control circuit of claim 26, wherein the control circuit is configured so that only two bias currents are asserted at a time throughout the gain range, and wherein each asserted bias current is linearly varied between a predetermined minimum current level and a predetermined maximum current level.

28. The gain control circuit of claim 27, wherein the control circuit is configured so that a first bias current is linearly decreased from the maximum current level to the minimum current level while a second bias current is linearly increased from the minimum current level to the maximum current level to change the gain from a first gain level to a second gain level, wherein the second bias current is linearly decreased from the maximum current level to the minimum current level while a third bias current is linearly increased from the minimum current level to the maximum current level to change the gain from the second gain level to a third gain level, and wherein the third bias current is linearly decreased from the maximum current level to the minimum current level while a fourth bias current is linearly increased from the minimum current level to the maximum current level to change the gain from the second gain level to a third gain level.

29. The gain control circuit of claim 28, wherein the control circuit receives a differential gain adjust control current and comprises a plurality of current summing and current differencing circuits.

30. The gain control circuit of claim 29, wherein the control circuit includes a plurality of current differencing circuits, each comprising a plurality of metal oxide semiconductor (MOS) transistors coupled together to form a pair of input terminals receiving the differential gain adjust control current and an output terminal asserting a difference current, and in which relative sizes of the MOS transistors are selected to achieve a desired differencing function.

31. The gain control circuit of claim 30, wherein each differencing circuit comprises first, second, third fourth P-channel MOS (PMOS) transistors, each having sources coupled to a supply signal, the drain of the first PMOS transistor forming the output terminal, the gates of the first and second PMOS transistors coupled together and to the drains of the second and third PMOS transistors forming a first input terminal, the gates of the third and fourth PMOS transistors coupled together and to the drain of the fourth PMOS transistor forming a second input terminal.

32. The gain control circuit of claim 29, wherein the control circuit includes at least one summing circuit comprising first and second P-channel MOS (PMOS) transistors having their sources coupled to the supply signal, their gates coupled together and to the drain of the second PMOS transistor forming a summing junction and the drain of the first PMOS transistor forming an output terminal.

* * * * *